(12) United States Patent
Tsao et al.

(10) Patent No.: US 10,211,700 B2
(45) Date of Patent: Feb. 19, 2019

(54) SERVO MOTOR AND CIRCUIT BOARD THEREOF

(71) Applicants: LITE-ON ELECTRONICS (GUANGZHOU) LIMITED, Guangzhou (CN); LITE-ON TECHNOLOGY CORPORATION, Taipei (TW)

(72) Inventors: Wei-Min Tsao, Taipei (TW); Chun-Lung Ho, Taipei (TW); Wei-Ting Lin, Taipei (TW)

(73) Assignees: LITE-ON ELECTRONICS (GUANGZHOU) LIMITED, Guangzhou (CN); LITE-ON TECHNOLOGY CORPORATION, Taipei (TW)

( * ) Notice: Subject to any disclaimer, the term of this patent is extended or adjusted under 35 U.S.C. 154(b) by 236 days.

(21) Appl. No.: 15/367,402

(22) Filed: Dec. 2, 2016

(65) Prior Publication Data

US 2018/0062477 A1 Mar. 1, 2018

(30) Foreign Application Priority Data

Aug. 30, 2016 (CN) .......................... 2016 1 0762922

(51) Int. Cl.
*H02K 5/22* (2006.01)
*H02K 5/16* (2006.01)
(Continued)

(52) U.S. Cl.
CPC ............... *H02K 5/225* (2013.01); *H02K 5/16* (2013.01); *H02K 11/0094* (2013.01);
(Continued)

(58) Field of Classification Search
CPC ...... H02K 5/225; H02K 5/16; H02K 11/0094; H05K 1/0256; H05K 1/111; H05K 2201/1009
See application file for complete search history.

(56) References Cited

U.S. PATENT DOCUMENTS 9,419,500 B2 8/2016 Ryu

FOREIGN PATENT DOCUMENTS

| CN | 103532313 A | 1/2014 |
|---|---|---|
| TW | M484856 U | 8/2014 |

OTHER PUBLICATIONS

TIPO Office Action dated Jun. 2, 2017 in Taiwan application (No. 105127884).

*Primary Examiner* — Emily P Pham
(74) *Attorney, Agent, or Firm* — McClure, Qualey & Rodack, LLP

(57) ABSTRACT

The servo motor includes a casing, a stator, a rotor and a circuit board. The casing has a hollow body, a first bearing and a second bearing. The hollow body is mounted between the first bearing and the second bearing. The stator is disposed inside the hollow body, and surrounds an axial hollow portion. The rotor is disposed inside the stator. A shaft passes through the rotor in an axial direction, and two ends of the shaft are respectively mounted on the first bearing and the second bearing. The circuit board is disposed inside the hollow body and interposed between the stator and the first bearing, the periphery of the circuit board has a plurality of solder pads electrically connected to the stator. An outer surface of the circuit board has a protection layer, which covers the region of the solder pads near the outer edge of the periphery.

10 Claims, 2 Drawing Sheets

(51) Int. Cl.
*H02K 11/00* (2016.01)
*H05K 1/02* (2006.01)
*H05K 1/11* (2006.01)

(52) U.S. Cl.
CPC ........... *H05K 1/0256* (2013.01); *H05K 1/111* (2013.01); *H05K 2201/1009* (2013.01)

SERVO MOTOR AND CIRCUIT BOARD THEREOF

This application claims the benefit of People's Republic of China application Serial No. 201610762922.5, filed Aug. 30, 2016, the subject matter of which is incorporated herein by reference.

BACKGROUND OF THE INVENTION

Field of the Invention

The invention relates in general to a motor, and more particularly to a servo motor and a circuit board thereof.

Description of the Related Art

Motors, such as direct current motors, servo motors, induction motors, stepper motors and synchronous motors, have been widely used in the control of lathes, transmission devices or robots. The stator of motor is twined with enameled copper coils. When the current flows through the stator coils, a magnetic field will be generated to drive the rotor of motor to rotate. Existing stator coils are connected to a circuit board, which provides a timing voltage to different blocks of the stator coils to control the rotor. If the solder on the circuit board is too close to the motor casing, the motor will easily end up with short-circuiting during high voltage test and fail to achieve safety standards.

SUMMARY OF THE INVENTION

The invention relates to a servo motor and a circuit board thereof capable of increasing the safety distance between the solder pads on the circuit board and the casing to satisfy the safety standards.

According to one embodiment of the present invention, a servo motor including a casing, a stator, a rotor, and a circuit board is provided. The casing has a hollow body, a first bearing and a second bearing. The hollow body is mounted between the first bearing and the second bearing. The stator is disposed inside the hollow body, and surrounds an axial hollow portion. The rotor is disposed inside the stator. A shaft passes through the rotor in an axial direction, and two ends of the shaft are respectively mounted on the first bearing and the second bearing. The circuit board is disposed inside the hollow body and interposed between the stator and the first bearing. A periphery of the circuit board has a plurality of solder pads electrically connected to the stator. An outer surface of the circuit board has a protection layer, which covers the region of the solder pads near the outer edge of the periphery.

According to another embodiment of the present invention, a circuit board is provided. A periphery of the circuit board has a plurality of solder pads. An outer surface of the circuit board has a protection layer, which covers the region of the solder pads near the outer edge of the periphery.

The above and other aspects of the invention will become better understood with regard to the following detailed description of the preferred but non-limiting embodiment(s). The following description is made with reference to the accompanying drawings.

DETAILED DESCRIPTION OF THE INVENTION

A number of embodiments are disclosed below for elaborating the invention. However, the embodiments of the invention are for detailed descriptions only, not for limiting the scope of protection of the invention.

Figure 1:
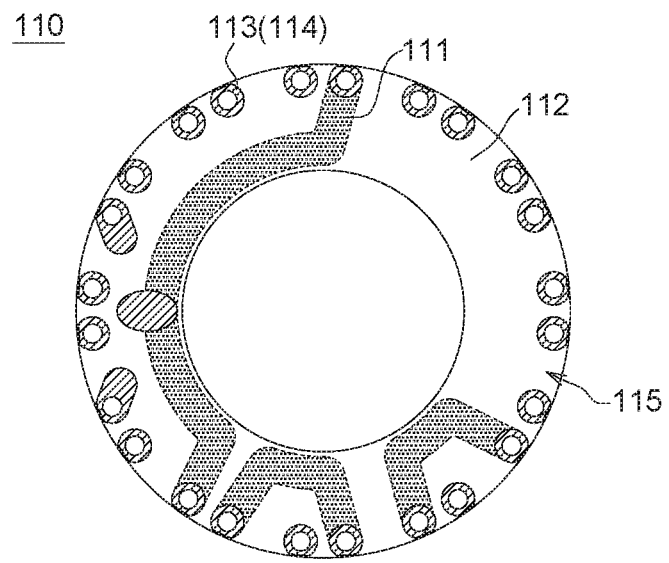
FIG. 1 is a schematic diagram of a circuit board according to an embodiment of the invention, wherein the circuit board is not covered with the protection layer.
Figure 2:
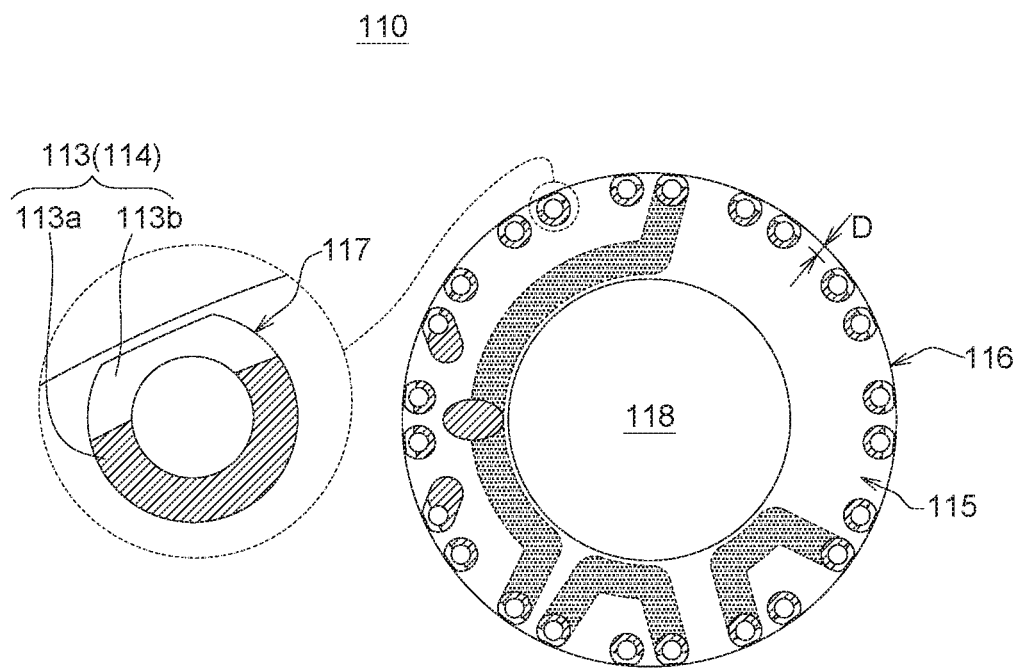
FIG. 2 is a schematic diagram and an enlarged view of the outer surface of the circuit board of FIG. 1 covered with the protection layer.

Refer to FIG. 1 and FIG. 2. The circuit board 110 according to an embodiment of the invention can be formed by a plurality of circuit layers 111 and a plurality of insulating layers 112 stacking together. The circuit layers 111 can be four or six layers, and each circuit layer 111 is connected between different solder pads 113 for transmitting signals. The periphery 116 of the circuit board 110 has a plurality of solder pads 113 penetrating the insulating layers 112 and electrically connected to at least one circuit layer 111. The solder pads 113 can be copper pads. In FIG. 1, each of the solder pads 113 forms a hollow circle, and each solder pad 113 has an exposed annular outer surface 114. The solder can cover the annular outer surface 114 and consolidate to form a sphere. The solder pads 113 are not necessary circular, and can have other shapes such as oval, square, rectangle, other polygon or irregular shape.

To avoid the solder being too close to the motor casing (the hollow body 101 of FIG. 3), in FIG. 2, the outer surface 115 of the circuit board 110 has a protection layer 117 (such as green paint), which covers the region of each solder pad 113 near the outer edge of the periphery 116. The protection layer 117 has insulation effect and avoids the solder on the annular outer surface 114 becoming short-circuited easily during the high voltage test and therefore failing to achieve safety standards.

Refer to FIG. 2. The region 113b of the solder pads 113 covered by the protection layer 117 is about ¼-½ of the area of annular outer surface 114. When the region 113b of the solder pads 113 covered by the protection layer 117 reaches ¼ of the area of the annular outer surface 114, a minimum distance D between the exposed region 113a and the outmost edge of the circuit board 110 is about ¼ of the diameter of the annular outer surface 114. When the region 113b of the solder pads 113 covered by the protection layer 117 reaches ½ of the area of the annular outer surface 114, the minimum distance D between the exposed region 113a and the outmost edge of the circuit board 110 is about ½ of the diameter of the annular outer surface 114. Preferably, the minimum distance D is smaller than ½ of the diameter of the annular outer surface 114 to avoid the attachable area of the solder being decreased. Therefore, the safety distance, such as 1~3 mm, can be arranged to achieve safety standards during high voltage test by adjusting the minimum distance D between the exposed region 113a of the solder pad 113 and the outmost edge of the circuit board 110.

Figure 3:
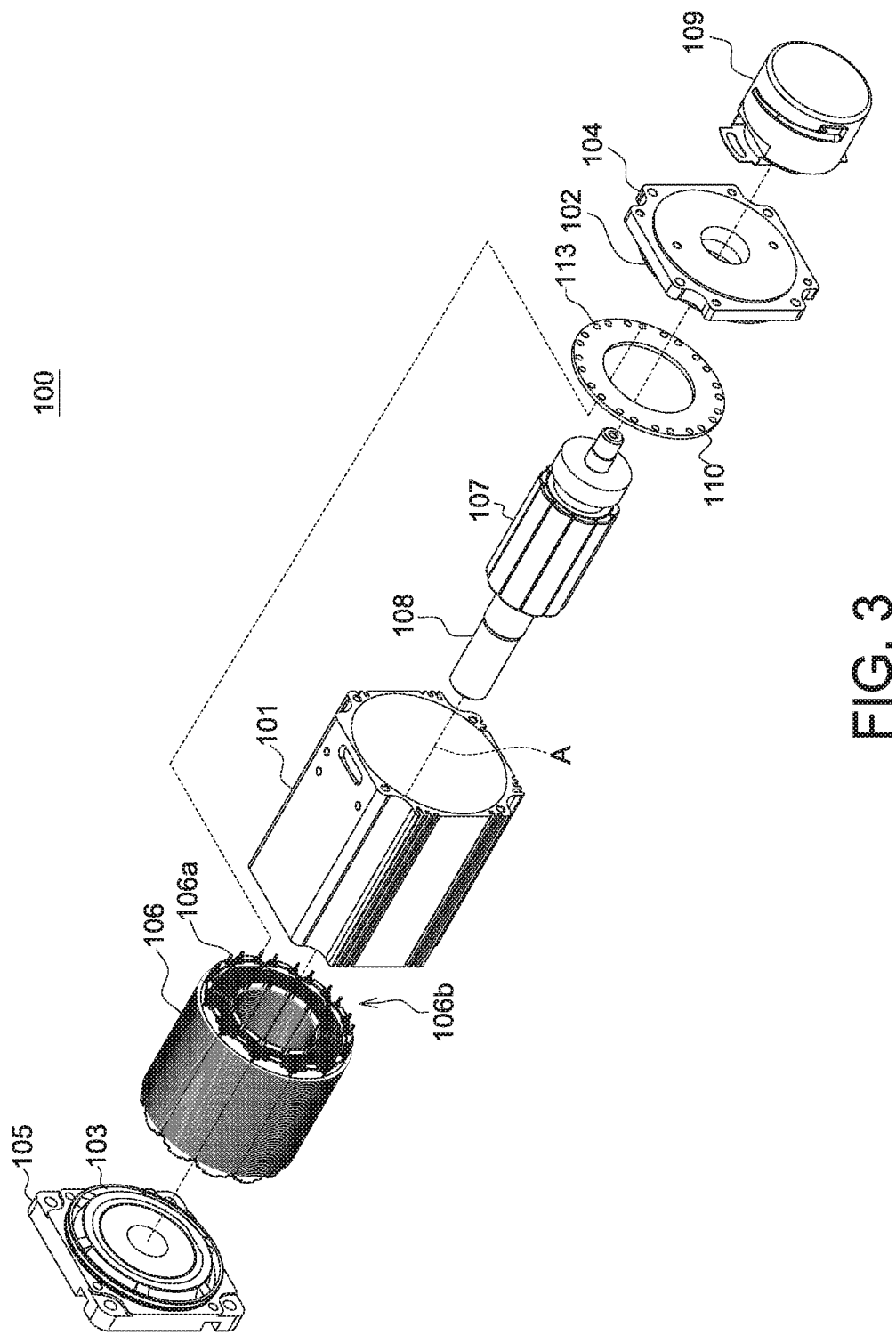
FIG. 3 is an explosion diagram of a servo motor according to an embodiment of the invention.

Refer to FIG. 3. The servo motor 100 according to an embodiment of the invention includes a hollow body 101, a first bearing 102, a second bearing 103, a stator 106, a rotor 107, a controller 109 and a circuit board 110. A first bearing fastener 104 and a second bearing fastener 105 are disposed on two ends of the hollow body 101, such that the servo motor 100 can be fixed on a device, such as lathe, transmission device and robot, through the first bearing fastener 104 and the second bearing fastener 105. The hollow body 101 is mounted between the first bearing 102 and the second bearing 103 to form a closed casing. The stator 106 is disposed inside the hollow body 101 and surrounds an axial hollow portion 106b. The rotor 107 is disposed inside the axial hollow portion 106b of the stator 106. A shaft 108 passes through the rotor 107 in an axial direction A, and two ends of the shaft 108 are mounted on the first bearing 102 and the second bearing 103, respectively.

Stator coils are twined around different blocks of the stator 106 to generate a magnetic field which drives the rotor 107 to rotate. Besides, the controller 109 is disposed on the first bearing fastener 104 and electrically connected to the circuit board 110 to generate a timing control signal. Therefore, the circuit board 110 can provide a timing voltage to different blocks of the stator coils through the solder pads 113 to control the rotation speed of the rotor 107.

The circuit board 110 of the present embodiment can be used in different types of motors, such as direct current motors, induction motors, stepper motors and synchronous motors, and is not limited to the use in servo motors.

Refer to FIG. 2 and FIG. 3. The circuit board 110 is disposed inside the hollow body 101 and interposed between the stator 106 and the first bearing fastener 104. The periphery 116 of the circuit board 110 has a plurality of solder pads 113 electrically connected to the pins 106a of the stator 106, wherein the pins 106a of the stator 106 pass through the solder pads 113 and are fixed on the solder pads 113 using solder. The outer surface 115 of the circuit board 110 has a protection layer 117, which covers the region of the solder pads 113 near the outer edge of the periphery 116 as indicated in FIG. 2. Moreover, the center of the circuit board 110 has an opening 118 through which the circuit board 110 is mounted on the first bearing 102.

As disclosed above, the protection layer 117 covers the region of the solder pads 113 near the outer edge of the periphery 116, and therefore avoids the solder on the solder pads 113 being too close to the motor casing (the hollow body 101) and becoming short-circuited easily during the high voltage test and failing to achieve safety standards. Therefore, the insulation and high voltage test characteristics of the servo motor 100 of the present embodiment are significantly improved.

While the invention has been described by way of example and in terms of the preferred embodiment(s), it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A servo motor comprising:
a casing having a hollow body, a first bearing and a second bearing, wherein the hollow body is mounted between the first bearing and the second bearing;
a stator disposed inside the hollow body and surrounding an axial hollow portion;
a rotor disposed inside the stator, wherein a shaft passes through the rotor in an axial direction, and two ends of the shaft are respectively mounted on the first bearing and the second bearing;
a circuit board disposed inside the hollow body and interposed between the stator and the first bearing, wherein a periphery of the circuit board has a plurality of solder pads electrically connected to the stator; and
a protection layer formed on an outer surface of the circuit board,
wherein each of the solder pads has a covered region near an outer edge of the periphery which is covered by the protection layer for insulation and an exposed region which is not covered by the protection layer.

2. The servo motor according to claim 1, wherein the center of the circuit board has an opening through which the circuit board is mounted on the first bearing.

3. The servo motor according to claim 1, wherein each of the solder pads has a shape of hollow circle and an annular outer surface.

4. The servo motor according to claim 3, wherein the region of each of the solder pads covered by the protection layer is ¼~½ of the area of the annular outer surface.

5. The servo motor according to claim 3, wherein a minimum distance between an exposed region of the solder pads not covered by the protection layer and an outmost edge of the circuit board is ¼~½ of a diameter of the annular outer surface.

6. A circuit board whose periphery has a plurality of solder pads disposed thereon, wherein a protection layer is formed on an outer surface of the circuit board, wherein each of the solder pads has a covered region near an outer edge of the periphery which is covered by the protection layer for insulation and an exposed region which is not covered by the protection layer.

7. The circuit board according to claim 6, wherein the center of the circuit board has an opening.

8. The circuit board according to claim 6, wherein each of the solder pads has a shape of a hollow circle and an annular outer surface.

9. The circuit board according to claim 8, wherein the region of each of the solder pads covered by the protection layer is ¼~½ of the area of the annular outer surface.

10. The circuit board according to claim 8, wherein a minimum distance between an exposed region of the solder pads not covered by the protection layer and an outmost edge of the circuit board is ¼~½ of a diameter of the annular outer surface.

* * * * *